(12) United States Patent
Shiah et al.

(10) Patent No.: US 10,387,047 B2
(45) Date of Patent: Aug. 20, 2019

(54) MEMORY CIRCUIT WITH IMPROVED READ AND WRITE ACCESS

(71) Applicant: Etron Technology, Inc., Hsinchu (TW)

(72) Inventors: Chun Shiah, Hsinchu (TW);
Cheng-Nan Chang, Tainan (TW);
Yu-Hui Sung, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 15/358,072

(22) Filed: Nov. 21, 2016

(65) Prior Publication Data

US 2017/0147211 A1 May 25, 2017

Related U.S. Application Data

(60) Provisional application No. 62/257,241, filed on Nov. 19, 2015.

(51) Int. Cl.
| | |
|---|---|
| *G06F 3/06* | (2006.01) |
| *G11C 11/4091* | (2006.01) |
| *G11C 11/408* | (2006.01) |
| *G11C 11/4096* | (2006.01) |
| *G06F 12/0893* | (2016.01) |
| *G11C 16/06* | (2006.01) |
| *G11C 29/34* | (2006.01) |

(Continued)

(52) U.S. Cl.
CPC .............. *G06F 3/061* (2013.01); *G06F 3/065* (2013.01); *G06F 3/0644* (2013.01); *G06F 3/0659* (2013.01); *G06F 3/0673* (2013.01); *G06F 12/0893* (2013.01); *G11C 11/4076* (2013.01); *G11C 11/4085* (2013.01); *G11C 11/4087* (2013.01); *G11C 11/4091* (2013.01); *G11C 11/4096* (2013.01); *G11C 16/06* (2013.01); *G11C 29/34* (2013.01); *G11C 29/06* (2013.01); *G11C 2207/2236* (2013.01)

(58) Field of Classification Search
CPC ...... G06F 3/061; G06F 3/0659; G06F 3/0673; G06F 3/065; G06F 3/0644; G11C 11/4091; G11C 11/4096; G11C 11/4087
See application file for complete search history.

(56) References Cited

U.S. PATENT DOCUMENTS

| 5,666,315 A | 9/1997 | Tsukude |
| 5,953,278 A | 9/1999 | McAdams |

(Continued)

FOREIGN PATENT DOCUMENTS

TW 201335757 A1 9/2013

*Primary Examiner* — Ajay Ojha
(74) *Attorney, Agent, or Firm* — Winston Hsu (57) ABSTRACT

A memory circuit includes a plurality of banks and a controller, each bank of the plurality of banks includes a plurality of segments, and each segment of the plurality of segments includes a plurality of bit lines and a plurality of word lines. A word line switch corresponding to a word line of a segment of the memory circuit is turned on and data are written into memory cells of the segment coupled to a plurality of bit lines of the segment and corresponding to the word line in turn after the controller enables an active command corresponding to the word line. When the controller enables at least one copy row write command, the data are simultaneously written into memory cells sharing a plurality of sense amplifiers with the plurality of bit lines of the segment and corresponding to at least one another word line.

10 Claims, 7 Drawing Sheets

(51) Int. Cl.
*G11C 11/4076* (2006.01)
*G11C 29/06* (2006.01)

(56) References Cited

U.S. PATENT DOCUMENTS

| | | | |
|---|---|---|---|
| 6,023,745 A * | 2/2000 | Lu ..................... | G06F 12/0215 |
| | | | 711/149 |
| 6,359,825 B1 | 3/2002 | Aimoto | |
| 6,836,419 B2 * | 12/2004 | Loughmiller .......... | G11C 15/04 |
| | | | 365/149 |
| 7,342,835 B2 * | 3/2008 | Tu ..................... | G11C 7/1018 |
| | | | 365/185.25 |
| 2001/0022752 A1 * | 9/2001 | Duesman ............... | G11C 29/34 |
| | | | 365/201 |
| 2004/0037107 A1 | 2/2004 | Matsuoka | |
| 2005/0146974 A1 * | 7/2005 | Halbert ............... | G06F 12/0893 |
| | | | 365/230.03 |
| 2008/0219059 A1 | 9/2008 | Li | |
| 2009/0059702 A1 | 3/2009 | Sekiguchi | |
| 2013/0229868 A1 | 9/2013 | Koh | |
| 2016/0284390 A1 * | 9/2016 | Tomishima ......... | G11C 11/4091 |
| 2017/0075595 A1 * | 3/2017 | Maejima ............... | G11C 16/06 |

* cited by examiner

MEMORY CIRCUIT WITH IMPROVED READ AND WRITE ACCESS

CROSS REFERENCE TO RELATED APPLICATIONS

This application claims the benefit of U.S. Provisional Application No. 62/257,241, filed on 2015 Nov. 19 and entitled "Group-write and Copy-row in memory," the contents of which are incorporated herein by reference.

BACKGROUND OF THE INVENTION

1. Field of the Invention

The present invention relates to a memory circuit, and particularly to a memory circuit that can be capable of being quickly written in/read data.

2. Description of the Prior Art

Figure 1:
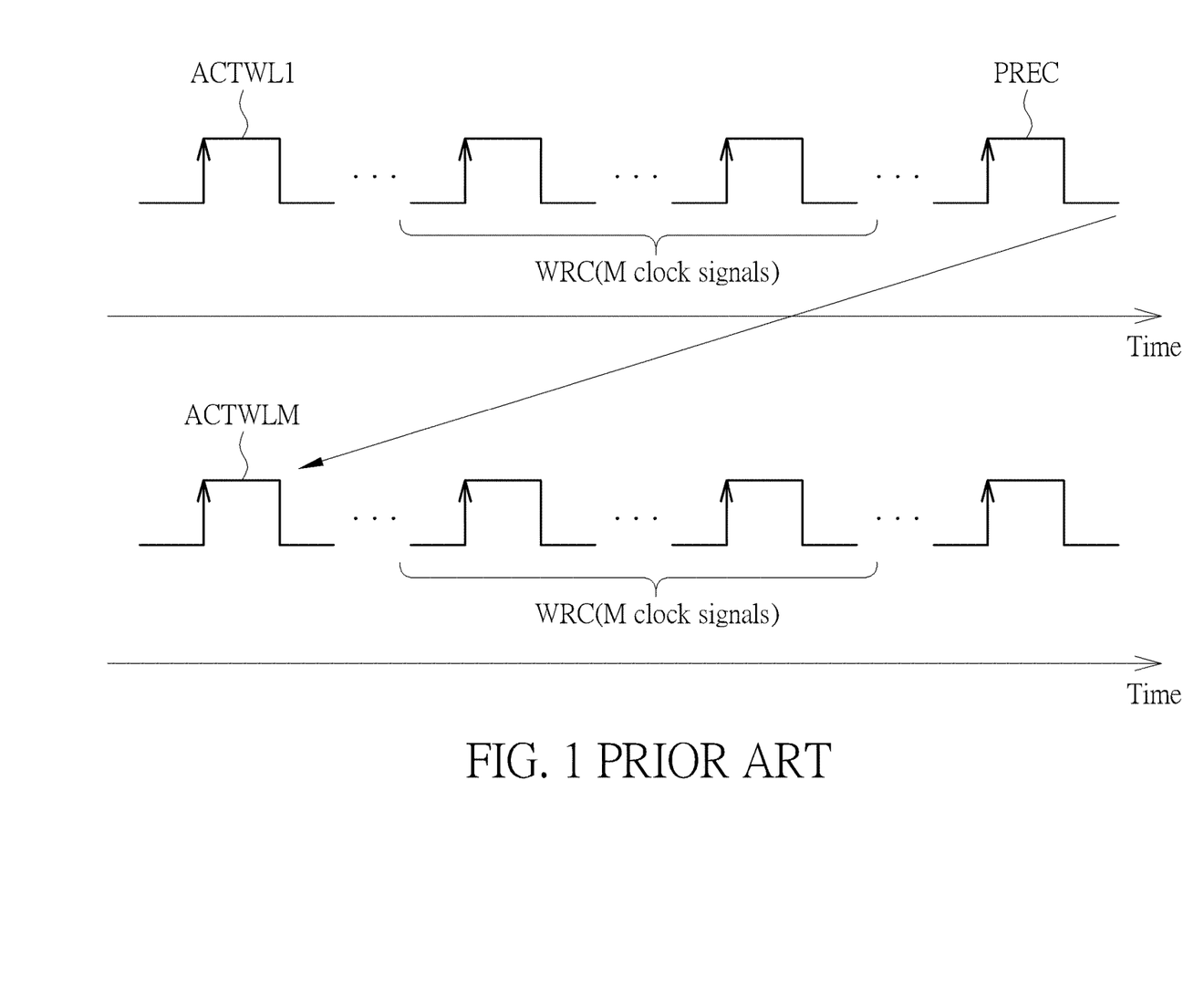
FIG. 1 is a timing diagram illustrating an active command, a write command, and a pre-charge command of the prior art.

When an application unit coupled to a memory circuit needs to write data to memory cells corresponding to a word line WL1 of a segment of a bank of the memory circuit, a controller of the memory circuit first enables an active command ACTWL1 (as shown in FIG. 1) corresponding to an address of the word line WL1. Then, after the controller enables the active command ACTWL1, a word line switch corresponding to the word line WL1 can be turned on according to the active command ACTWL1. After the controller enables the active command ACTWL1, the controller enables a write command WRC. After the controller enables the write command WRC, bit switches of memory cells of the segment MS1 corresponding to the word line WL1 can be turned on according to the write command WRC, wherein a number of the bit switches of the memory cells of the segment MS1 corresponding to the word line WL1 is M, and M is an integer greater than 1. Therefore, after the bit switches of the memory cells of the segment MS1 are turned on, the data can be written into the memory cells of the segment MS1 corresponding to the word line WL1 in turn.

As shown in FIG. 1, because the bit switches are turned on according to the write command WRC, the write command WRC needs to include M clock signals making the bit switches be turned on after the active command ACTWL1, wherein time for writing the data into the memory cells corresponding to the word line WL1 at least includes time of the M clock signals and time of the active command ACTWL1. In addition, after the write command WRC, the controller can enable a pre-charge command PREC corresponding to an address of the word line WL1, and the word line switch corresponding to the word line WL1 is turned off according to the pre-charge command PREC.

As shown in FIG. 1, if the application unit needs to write the data to memory cells corresponding to a word line WLM of the segment, the above mentioned steps for writing the data to the memory cells corresponding to the word line WL1 need to be executed again. That is to say, although the application unit writes the same data (the data) to the memory cells corresponding to the word line WLM, writing the same data (the data) to the memory cells corresponding to the word line WLM still needs to at least take the time of the M clock signals and the time of the active command ACTWL1, wherein FIG. 1 illustrates a timing of the active commands ACTWL1, ACTWLM, the write command WRC, and the pre-charge command PREC enabled by the controller of the memory circuit. Therefore, the prior art is not a good operation method for the memory circuit.

SUMMARY OF THE INVENTION

An embodiment of the present invention provides a memory circuit into which data can be written quickly. The memory circuit includes a plurality of banks and a controller. Each bank of the plurality of banks includes a plurality of segments, and each segment of the plurality of segments includes a plurality of bit lines and a plurality of word lines. After the data are written into memory cells of a segment coupled to a plurality of bit lines of the segment and corresponding to a word line of the segment in turn and when the controller enables at least one copy row write command, the data are simultaneously written into memory cells sharing a plurality of sense amplifiers with the plurality of bit lines of the segment and corresponding to at least one another word line, wherein the at least one another word line corresponds to the at least one copy row write command.

Another embodiment of the present invention provides a memory circuit from which data can be read quickly. The memory circuit includes a plurality of banks and a controller. Each bank of the plurality of banks includes a plurality of segments, and each segment of the plurality of segments includes a plurality of bit lines and a plurality of word lines. After the data are written into memory cells of a segment coupled to a plurality of bit lines of the segment and corresponding to a word line of the segment in turn, the controller controls a word line switch corresponding to the word line to be turned off. The word line switch corresponding to the word line is turned on when the controller enables an active command corresponding to the word line of the segment. The data are written into a plurality of sense amplifiers coupled to the plurality of bit lines of the segment, and the plurality of sense amplifiers simultaneously write the data into memory cells sharing the plurality of sense amplifiers with the plurality of bit lines of the segment and corresponding to at least one another word line.

Another embodiment of the present invention provides a memory circuit into which data can be written quickly. The memory circuit includes a plurality of memory cells and a controller, wherein the plurality of memory cells is coupled to a sense amplifier together, and the controller is coupled to the plurality of memory cells. When the controller needs to write identical data into a first memory cell group and at least one second memory cell group of the plurality of memory cells, the controller utilizes the sense amplifier to directly copy data written into the first memory cell group to the at least one second memory cell group Another embodiment of the present invention provides a memory circuit from which data can be read quickly. The memory circuit includes a plurality of memory cells and a controller, wherein the plurality of memory cells is coupled to a sense amplifier together, and the controller is coupled to the plurality of memory cells. When the controller needs to write data stored in a first memory cell group of the plurality of memory cells to at least one second memory cell group of the plurality of memory cells, the controller controls the first memory cell group to be electrically connected to the sense amplifier again, and utilizes the sense amplifier to directly copy the data stored in the first memory cell group to the at least one second memory cell group.

Another embodiment of the present invention provides a memory circuit into which data can be written quickly. The memory circuit includes a command decoder, a plurality of memory cells, and a controller. The command decoder receives a command control signal group and generating a decode command according to the command control signal group. The plurality of memory cells are coupled to a sense amplifying circuit together, wherein the sense amplifying circuit includes a plurality of sense amplifiers. The controller receives the decode command, and optionally one-time copying data stored in a first memory cell group of the plurality of memory cells to a second memory cell group of the plurality of memory cells according to the decode command.

The present invention provides a memory circuit. The memory circuit can simultaneously write data which are originally written to memory cells of a segment coupled to bit lines of the segment and corresponding to a word line of the segment to memory cells sharing a plurality of sense amplifiers with the bit lines of the segment and corresponding to at least one another word line according to a technical feature of a plurality of bit lines of the memory circuit sharing a sense amplifier. Thus, compared to the prior art, the present invention can significantly reduce time for the data being written to the memory cells corresponding to the at least one another word line.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
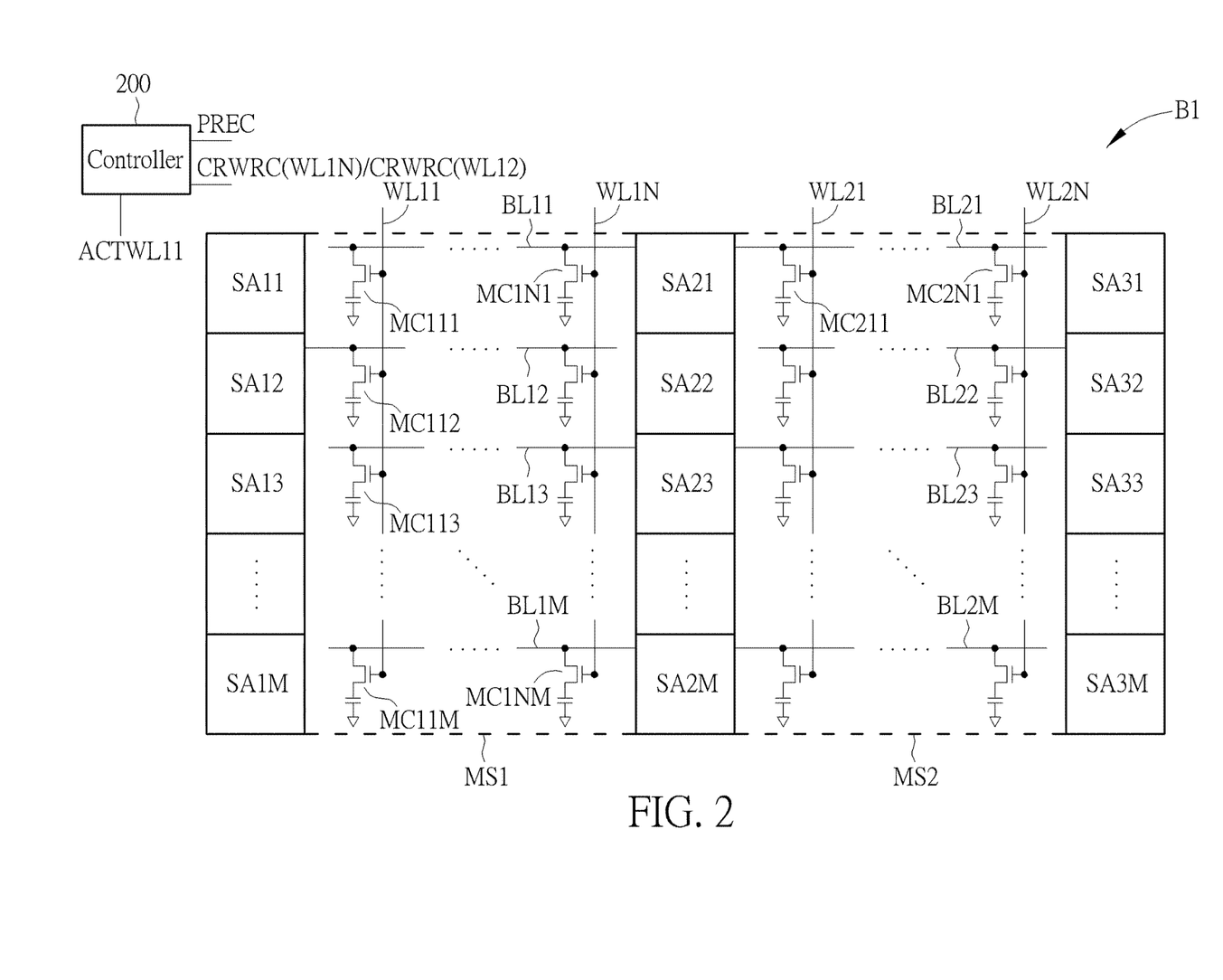
FIG. 2 is a diagram illustrating segments of a bank of a memory circuit capable of being quickly written in data according to a first embodiment of the present invention.

Please refer to FIG. 2. FIG. 2 is a diagram illustrating segments MS1, MS2 of a bank B1 of a memory circuit capable of being quickly written in data according to a first embodiment of the present invention, wherein the memory circuit includes a plurality of banks and a controller 200, BL11-BL1M are bit lines of the segment MS1, WL11-WL1N are word lines of the segment MS1, MC111, MC11M, MC1N1, MC1NM are memory cells of the segment MS1, BL21-BL2M are bit lines of the segment MS2, WL21-WL2N are word lines of the segment MS2, MC211, MC21M, MC2N1, MC2NM are memory cells of the segment MS2, SA11-SA1M, SA21-SA2M, SA31-SA3M are sense amplifiers of the memory circuit, each two bit lines share a sense amplifier (e.g. the bit line BL11 of the segment MS1 and the bit line BL21 of the segment MS2 share the sense amplifier SA21, the bit line BL13 of the segment MS1 and the bit line BL23 of the segment MS2 share the sense amplifier SA23, and so on), the memory circuit is a dynamic random access memory (DRAM), and N, M are integers greater than 1. But, the present invention is not limited to two bit lines sharing a sense amplifier. That is to say, in another embodiment of the present invention, a plurality of bit lines can share a sense amplifier.

Figure 3:
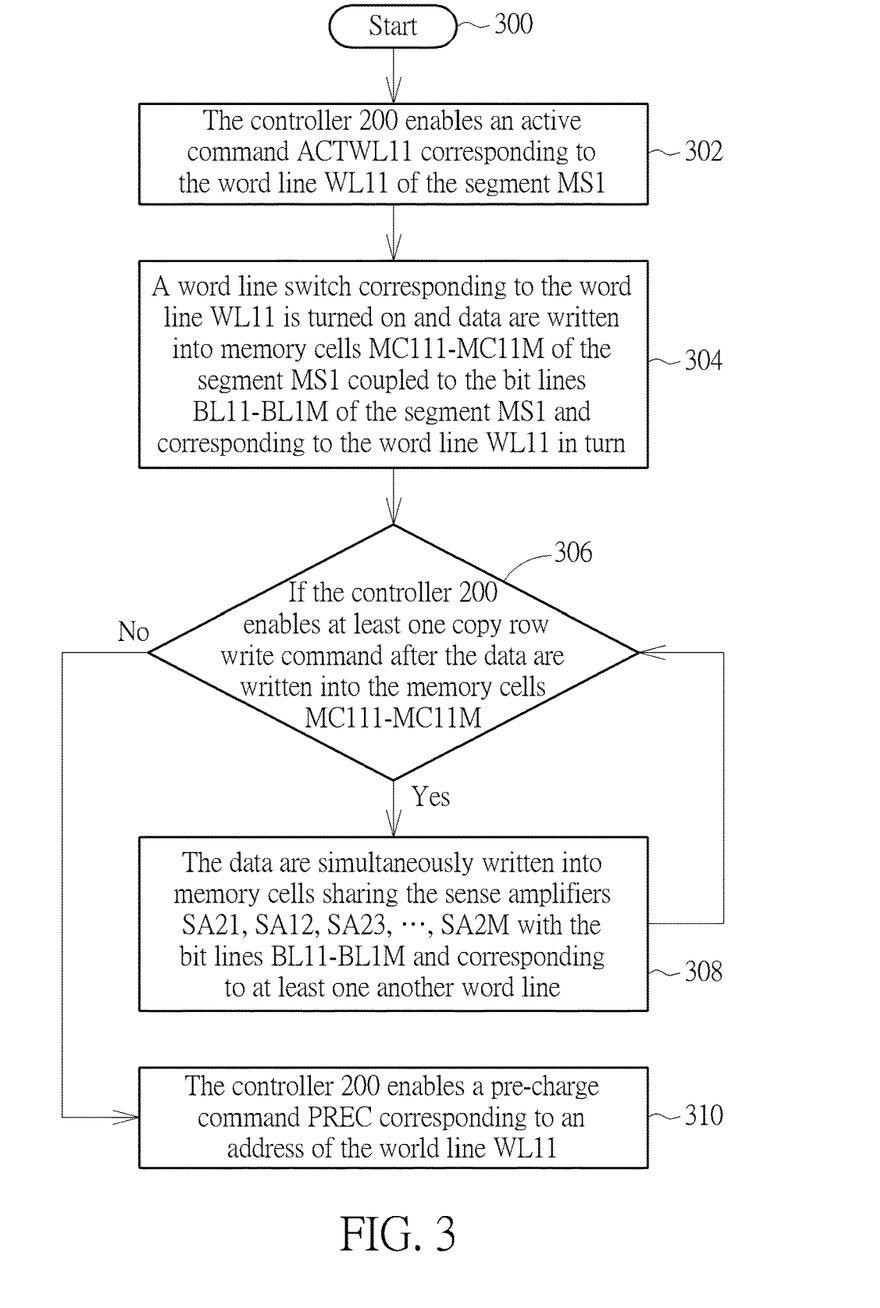
FIG. 3 is a flowchart illustrating an operation method capable of quickly writing data into a memory circuit according to a second embodiment of the present invention.
Figure 4:
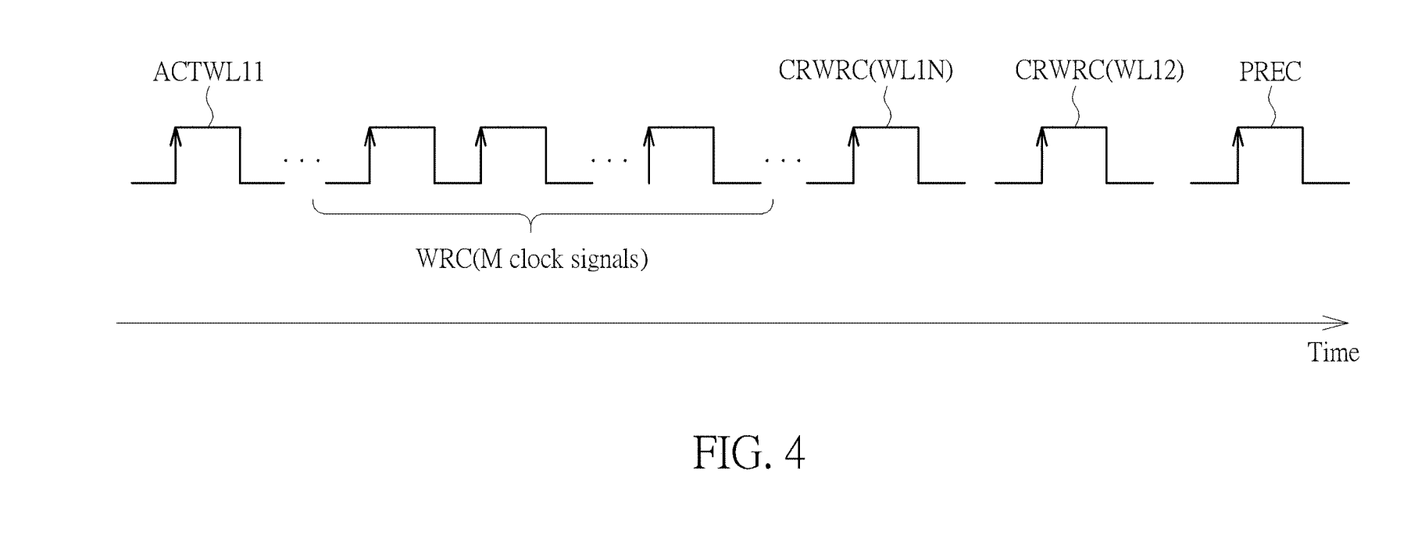
FIG. 4 is a timing diagram illustrating an active command, a write command, a copy row write command, and a pre-charge command.

Please refer to FIGS. 2-4. FIG. 3 is a flowchart illustrating an operation method capable of quickly writing data into a memory circuit according to a second embodiment of the present invention. The operation method in FIG. 3 is illustrated using the segments MS1, MS2 and the sense amplifiers SA11-SA1M, SA21-SA2M in FIG. 2. Detailed steps are as follows:

Step 300: Start.

Step 302: The controller 200 enables an active command ACTWL11 corresponding to the word line WL11 of the segment MS1.

Step 304: A word line switch corresponding to the word line WL11 is turned on and data are written into memory cells MC111-MC11M of the segment MS1 coupled to the bit lines BL11-BL1M of the segment MS1 and corresponding to the word line WL11 in turn.

Step 306: If the controller 200 enables at least one copy row write command after the data are written into the memory cells MC111-MC11M; if yes, go to Step 308; if no, go to Step 310.

Step 308: The data are simultaneously written into memory cells sharing the sense amplifiers SA21, SA12, SA23, . . . , SA2M with the bit lines BL11-BL1M and corresponding to at least one another word line.

Step 310: The controller 200 enables a pre-charge command PREC corresponding to an address of the world line WL11.

In Step 304, as shown in FIGS. 2, 4, after the controller 200 enables the active command ACTWL11, the word line switch corresponding to the word line WL11 (not shown in FIG. 2) can be turned on according to the active command ACTWL11. After the controller 200 enables the active command ACTWL11, the controller 200 enables a write command WRC. Then, after the controller 200 enables the write command WRC, bit switches of the segment MS1 corresponding to the memory cells MC111-MC11M can be turned on according to the write command WRC. After the bit switches corresponding to the memory cells MC111-MC11M are turned on, the data can be written into the memory cells MC111-MC11M in turn through the sense amplifiers SA21, SA12, SA23, . . . , SA2M. In Step 306, because the memory cells MC1N1-MC1NM of the segment MS1 corresponding to the word line WL1N share the sense amplifiers SA21, SA12, SA23, . . . , SA2M with the bit lines BL11-BL1M, if the data need to be written into the memory cells MC1N1-MC1NM of the segment MS1, the controller 200 can enable a copy row write command CRWRC (WL1N) corresponding to the word line WL1N, wherein because the word line switch corresponding to the word line WL11 is not turned off yet, the sense amplifiers SA21, SA12, SA23, . . . , SA2M can latch the data, and the copy row write command CRWRC(WL1N) can turn on a word line switch corresponding to the word line WL1N. In Step 308, because the word line switch corresponding to the word line WL11 is not turned off yet and the copy row write command CRWRC(WL1N) turns on the word line switch corresponding to the word line WL1N, the data can be simultaneously written into the memory cells MC1N1-MC1NM of the segment MS1 corresponding to word line WL1N through the sense amplifiers SA21, SA12, SA23, . . . , SA2M. As shown in FIG. 4, because the data are simultaneously written into the memory cells MC1N1-MC1NM of the segment MS1 through the sense amplifiers SA21, SA12, SA23, . . . , SA2M, time for the data being written into the memory cells MC1N1-MC1NM of the segment MS1 through the sense amplifiers SA21, SA12, SA23, . . . , SA2M is equal to time of the copy row write command CRWRC(WL1N). As shown in FIG. 4, because the write command WRC includes M clock signals making the bit switches corresponding to the memory cells MC111-MC11M being turned on, the time for the data being written into the memory cells MC1N1-MC1NM is less than time for the data being written into the memory cells MC111-MC11M.

Similarly, if the data need to be written into memory cells of the segment MS1 corresponding to the word line WL12 of the segment MS1, the controller 200 can enable a copy row write command CRWRC (WL12) corresponding to the word line WL12; and then, because the word line switch corresponding to the word line WL11 is not turned off yet, and the copy row write command CRWRC(WL12) turns on a word line switch corresponding to the word line WL12, the data can be simultaneously written into the memory cells the memory cells of the segment MS1 corresponding to the word line WL12 through the sense amplifiers SA21, SA12, SA23, . . . , SA2M.

In addition, as shown in FIG. 4, in Step 310, if the data do not need to be written into memory cells of the segment MS1 corresponding to other word lines again, the controller 200 can enable the pre-charge command PREC corresponding to the address of the world line WL11 after the copy row write command CRWRC(WL12), and the word line switch corresponding to the word line WL11 can be turned off according to the pre-charge command PREC. In addition, FIG. 4 illustrates a timing of the active command ACTWL11, the write command WRC, the copy row write command CRWRC(WL12), the copy row write command CRWRC (WL1N), and the pre-charge command PREC enabled by the controller 200 of the memory circuit.

In addition, in another embodiment of the present invention, the controller 200 is coupled to memory cells of the memory circuit. Therefore, as shown in FIG. 2, because the word line switch corresponding to the word line WL11 is not turned off yet, the controller 200 can directly write data stored in the memory cell MC111 into a memory cell of the segment MS1 coupled to the bit line BL11 and corresponding to the word line WL12 and a memory cell of the segment MS1 coupled to the bit line BL11 and corresponding to the word line WL1N through the bit line BL11 and the sense amplifier SA21 by enabling the copy row write command CRWRC(WL12) corresponding to the word line WL12 and the copy row write command CRWRC(WL1N) corresponding to the word line WL1N, wherein the copy row write command CRWRC(WL1N) can turn on the word line switch corresponding to the word line WL1N, the copy row write command CRWRC(WL12) can turn on the word line switch corresponding to the word line WL12, and the memory cells MC111-MC1N1 of the segment MS1 are coupled to the sense amplifier SA21 through the bit line BL11.

In addition, in another embodiment of the present invention, the controller 200 is coupled to the memory cells of the memory circuit, wherein a plurality of memory cells (e.g. the memory cells MC111-MC1N1 shown in FIG. 2) of the memory cells of the memory circuit are coupled to a sense amplifier (e.g. the sense amplifier SA21 shown in FIG. 2), the plurality of memory cells at least include a first memory cell group and at least one second memory cell group e.g. the memory cells MC111-MC1N1 shown in FIG. 2 are divided into the first memory cell group and the at least one second memory cell group), and a memory cell number of the first memory cell group and a memory cell number of the at least one second memory cell group can be identical or different. Therefore, after the controller 200 writes data to the first memory cell group, the controller 200 can utilize the above mentioned method and the sense amplifier (e.g. the sense amplifier SA21 shown in FIG. 2) to directly copy the data written into the first memory cell group to the at least one second memory cell group.

In addition, in another embodiment of the present invention, after the controller 200 writes the data to the first memory cell group, the controller 200 can control the first memory cell group to be electrically connected to the sense amplifier (e.g. the sense amplifier SA21 shown in FIG. 2) again, and utilizes the sense amplifier (e.g. the sense amplifier SA21 shown in FIG. 2) to directly copy the data written into the first memory cell group to the at least one second memory cell group.

In addition, in another embodiment of the present invention, the memory circuit includes a command decoder (not shown in FIG. 2), a plurality of memory cells, and a controller. The command decoder is used for receiving a command control signal group and generating a decode command according to the command control signal group. The plurality of memory cells (e.g. the memory cells MC111-MC11M and the memory cells MC1N1-MC1NM shown in FIG. 2) are coupled to a sense amplifying circuit together, wherein the sense amplifying circuit includes a plurality of sense amplifiers (e.g. the sense amplifiers SA21, SA12, SA23, . . . , SA2M shown in FIG. 2). The controller 200 is used for receiving the decode command (e.g. the copy row write command CRWRC(WL1N)), and optionally one-time copying data stored in a first memory cell group (e.g. the memory cells MC111-MC11M shown in FIG. 2) of the plurality of memory cells to a second memory cell group (e.g. the memory cells MC1N1-MC1NM shown in FIG. 2) of the plurality of memory cells according to the decode command.

Figure 5:
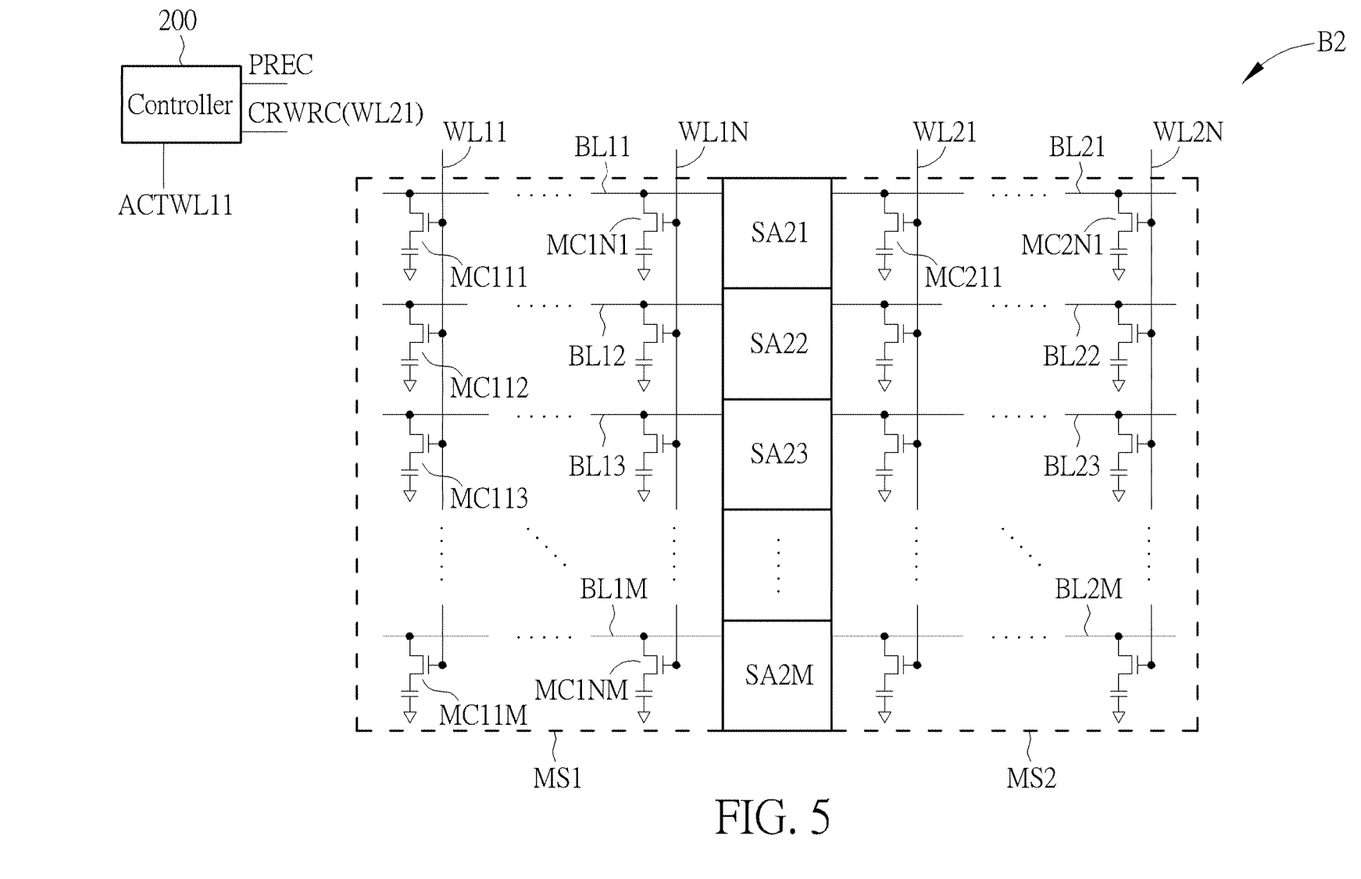
FIG. 5 is a diagram illustrating segments of a bank of a memory circuit capable of being quickly written in data according to a third embodiment of the present invention.

Please refer to FIG. 5. FIG. 5 is a diagram illustrating segments MS1, MS2 of a bank B2 of a memory circuit capable of being quickly written in data according to a third embodiment of the present invention, wherein as shown in FIG. 5, each two bit lines share a sense amplifier (e.g. a bit line BL11 of the segment MS1 and a bit line BL21 of the segment MS2 share a sense amplifier SA21, a bit line BL12 of the segment MS1 and a bit line BL22 of the segment MS2 share a sense amplifier SA22, and so on). Therefore, after data are written into memory cells MC111-MC11M of the segment MS1 corresponding to the word line WL11 through the sense amplifiers SA21, SA22, SA23, . . . , SA2M in turn, because memory cells MC211-MC21M of the segment MS2 corresponding to a word line WL21 of the segment MS2 share the sense amplifier SA21, SA22, SA23, . . . , SA2M with the bit lines BL11-BL1M of the segment MS1, if the data need to be written into the memory cells MC211-MC21M, the controller 200 can enable a copy row write command CRWRC(WL21) corresponding to the word line WL21, wherein because the word line switch corresponding to the word line WL11 is not turned off yet, the sense amplifiers SA21, SA22, SA23, . . . , SA2M can latch the data. Therefore, because the word line switch corresponding to the word line WL11 is not turned off yet, and the copy row write command CRWRC(WL21) turns on a word line switch corresponding to the word line WL21, the data can be simultaneously written into the memory cells MC211-MC21M of the segment MS2 through the sense amplifiers SA21, SA22, SA23, . . . , SA2M, wherein time for the data being written into the memory cells MC211-MC21M is less than time for the data being written into the memory cells MC111-MC11M.

Figure 6:
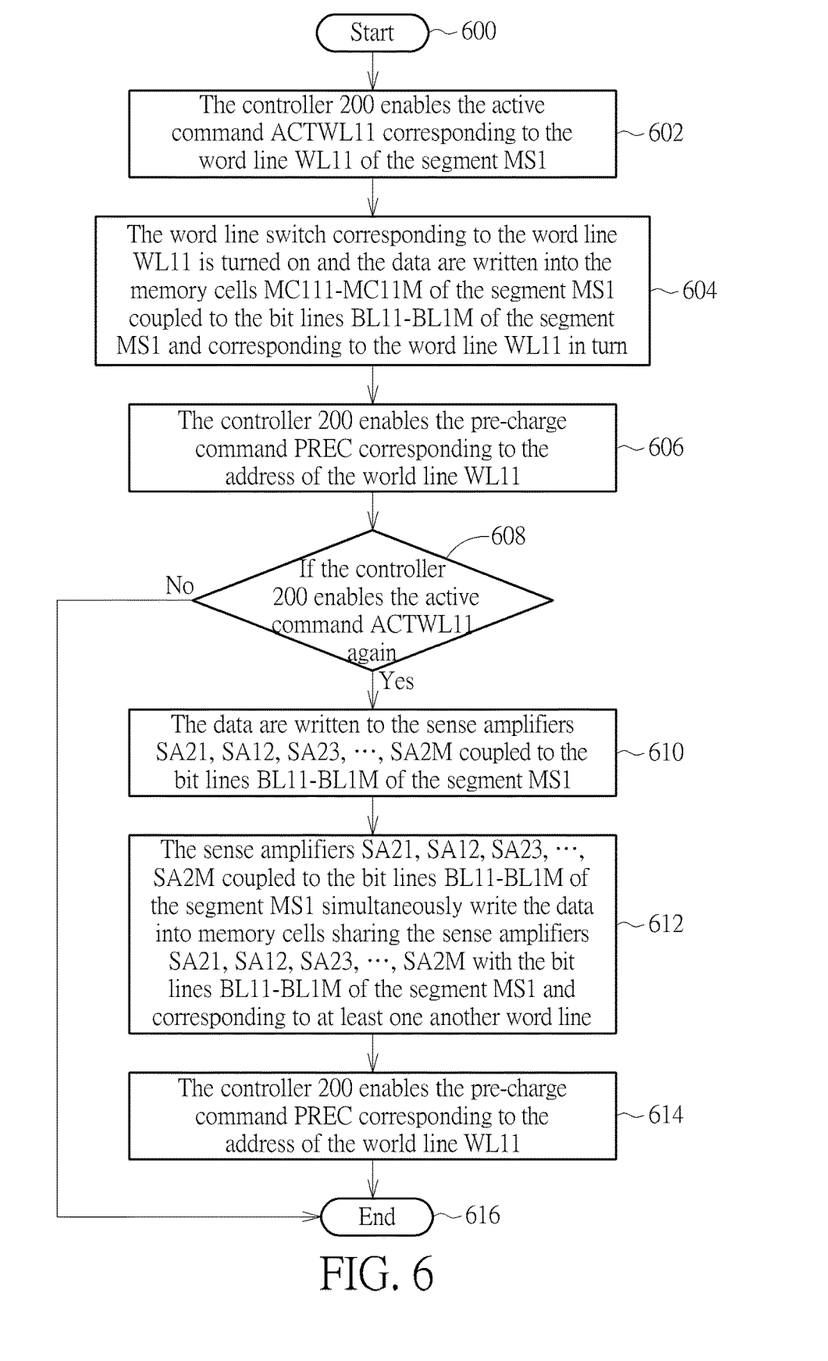
FIG. 6 is a flowchart illustrating an operation method capable of quickly read data from a memory circuit according to a fourth embodiment of the present invention
Figure 7:
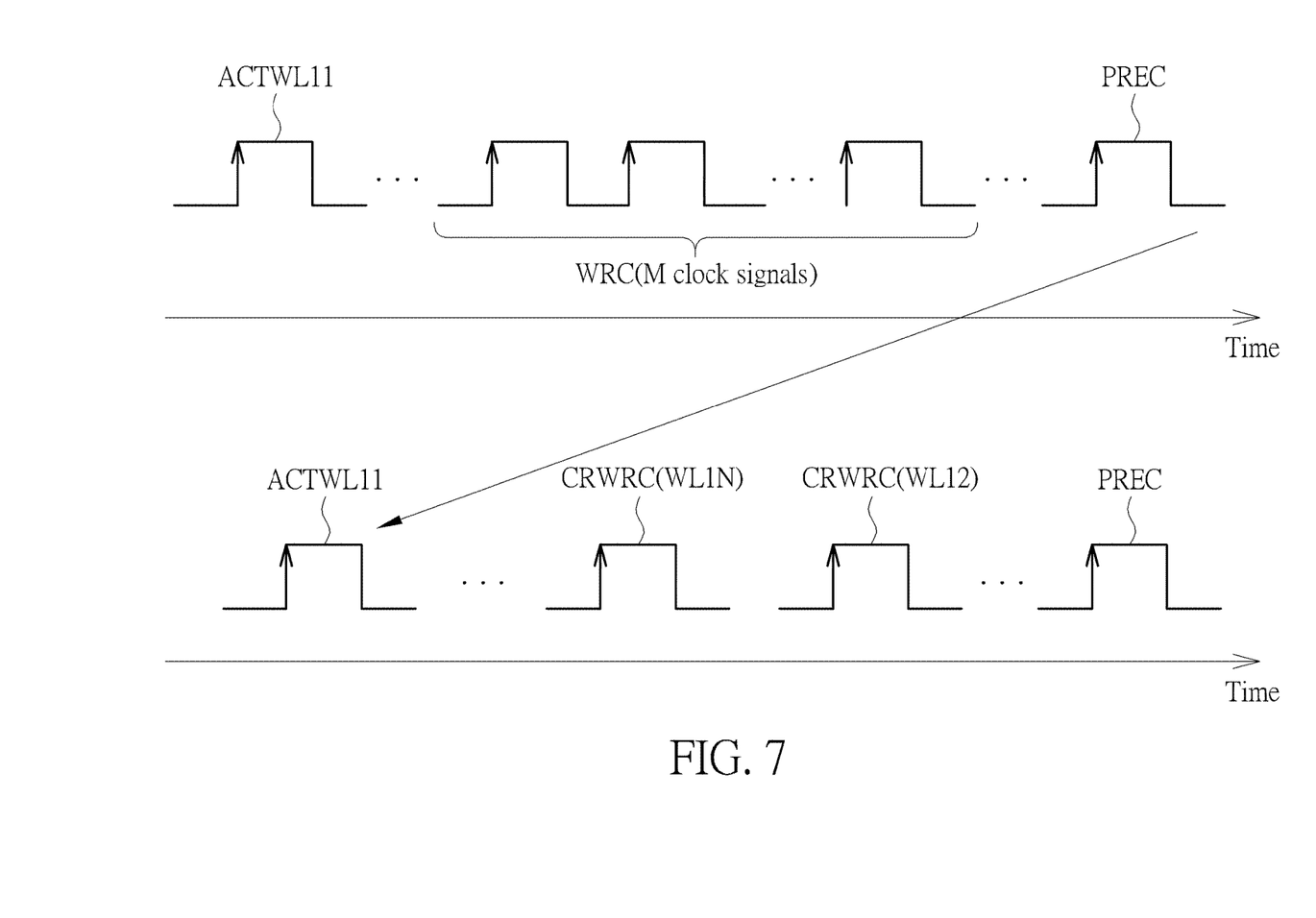
FIG. 7 is a timing diagram illustrating an active command, a write command, a copy row write command, and a pre-charge command.

Please refer to FIGS. 2, 6, 7. FIG. 6 is a flowchart illustrating an operation method capable of quickly read data from a memory circuit according to a fourth embodiment of the present invention. The operation method in FIG. 6 is illustrated using the segments MS1, MS2 and the sense amplifier SA11-SA1M, SA21-SA2M in FIG. 2. Detailed steps are as follows:

Step 600: Start.
Step 602: The controller 200 enables the active command ACTWL11 corresponding to the word line WL11 of the segment MS1.
Step 604: The word line switch corresponding to the word line WL11 is turned on and the data are written into the memory cells MC111-MC11M of the segment MS1 coupled to the bit lines BL11-BL1M of the segment MS1 and corresponding to the word line WL11 in turn.
Step 606: The controller 200 enables the pre-charge command PREC corresponding to the address of the world line WL11.
Step 608: If the controller 200 enables the active command ACTWL11 again; if yes, go to Step 610; if no, go to Step 616.
Step 610: The data are written to the sense amplifiers SA21, SA12, SA23, . . . , SA2M coupled to the bit lines BL11-BL1M of the segment MS1.
Step 612: The sense amplifiers SA21, SA12, SA23, . . . , SA2M coupled to the bit lines BL11-BL1M of the segment MS1 simultaneously write the data into memory cells sharing the sense amplifiers SA21, SA12, SA23, . . . , SA2M with the bit lines BL11-BL1M of the segment MS1 and corresponding to at least one another word line.
Step 614: The controller 200 enables the pre-charge command PREC corresponding to the address of the world line WL11.
Step 616: End.

Differences between the fourth embodiment in FIG. 6 and the second embodiment in FIG. 3 are that in Step 606, if the data do not need to be written into memory cells of the segment MS1 corresponding to other word lines temporarily, the controller 200 can enable the pre-charge command PREC corresponding to the address of the world line WL11 (as shown in FIG. 7) after the data are written into the memory cells MC111-MC11M, and the word line switch corresponding to the word line WL11 can be turned off according to the pre-charge command PREC; in Step 610, if the data need to be written into the memory cells MC1N1-MC1NM of the segment MS1 corresponding to the word line WL1N after the word line switch corresponding to the word line WL11 is turned off, the controller 200 can enable the active command ACTWL11 corresponding to the word line WL11 again, resulting in the word line switch corresponding to the word line WL11 being turned on again. Because the word line switch corresponding to the word line WL11 is turned on again, the data are written into the sense amplifiers SA21, SA12, SA23, . . . , SA2M coupled to the bit lines BL11-BL1M of the segment MS1.

As shown in FIG. 7, because the data need to be written to the memory cells MC1N1-MC1NM of the segment MS1 corresponding to the word line WL1N after the data are written to the sense amplifiers SA21, SA12, SA23, . . . , SA2M, the controller 200 can enable the copy row write command CRWRC(WL1N) corresponding to the word line WL1N after the active command ACTWL11. Therefore, the data can be simultaneously written to the memory cells MC1N1-MC1NM of the segment MS1 corresponding to the word line WL1N through the sense amplifiers SA21, SA12, SA23, SA2M.

In addition, as shown in FIG. 7, if the data still need to be written to the memory cells of the segment MS1 corresponding to the word line WL12, the controller 200 can enable the copy row write command CRWRC(WL12) corresponding to the word line WL12, so the data can be simultaneously written to the memory cells of the segment MS1 corresponding to the word line WL12 through the sense amplifiers SA21, SA12, SA23, SA2M. In addition, FIG. 7 illustrates a timing of the active command ACTWL11, the write command WRC, the copy row write command CRWRC(WL12), the copy row write command CRWRC(WL1N), and the pre-charge command PREC enabled by the controller 200 of the memory circuit.

In addition, the operation method in FIG. 6 can also be illustrated using the segments MS1, MS2 and the sense amplifiers SA21-SA2M of the bank B2 in FIG. 5, so further description thereof is omitted for simplicity.

To sum up, the memory circuit can simultaneously write data which are originally written to memory cells of a segment coupled to bit lines of the segment and corresponding to a word line of the segment to memory cells sharing a plurality of sense amplifiers with the bit lines of the segment and corresponding to at least one another word line according to a feature of a plurality of bit lines of the memory circuit sharing a sense amplifier. Thus, compared to the prior art, the present invention can significantly reduce time for the data being written to the memory cells corresponding to the at least one another word line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory circuit into which data can be written quickly, comprising:
    a plurality of banks, wherein each bank of the plurality of banks comprises a plurality of segments, and each segment of the plurality of segments comprises a plurality of bit lines and a plurality of word lines; and
    a controller;
    wherein after the data are written into memory cells of a segment coupled to a plurality of bit lines of the segment and corresponding to a word line of the segment in turn and when the controller enables at least one copy row write command, the data are simultaneously written into memory cells sharing a plurality of sense amplifiers with the plurality of bit lines of the segment and corresponding to at least one another word line, wherein the at least one another word line corresponds to the at least one copy row write command, a beginning of turning-on time of the word line is before a beginning of turning-on time of the at least one another word line, and the turning-on time of the at least one another word line is within the turning-on time of the word line;
    wherein during the turning-on time of the word line, a first word line switch, a second word line switch, and the plurality of sense amplifiers are enabled, wherein the first word line switch corresponds to the word line, and the second word line switch corresponds to the at least one another word line.

2. The memory circuit of claim 1, wherein during the at least one copy row write command being enabled, the first word line switch corresponding to the word line is not turned off.

3. The memory circuit of claim 1, wherein the segment comprises the at least one another word line or another segment different from the segment comprises the at least one another word line.

4. The memory circuit of claim 1, wherein after the controller enables an active command corresponding to the word line of the segment, the first word line switch corresponding to the word line is turned on and the data are written into the memory cells of the segment coupled to the plurality of bit lines of the segment and corresponding to the word line in turn.

5. A memory circuit from which data can be read quickly, comprising:
   a plurality of banks, wherein each bank of the plurality of banks comprises a plurality of segments, and each segment of the plurality of segments comprises a plurality of bit lines and a plurality of word lines; and
   a controller;
   wherein after the data are written into memory cells of a segment coupled to a plurality of bit lines of the segment and corresponding to a word line of the segment in turn, the controller controls a first word line switch corresponding to the word line to be turned off, the first word line switch is turned on when the controller enables an active command corresponding to the word line of the segment, the data are written into a plurality of sense amplifiers coupled to the plurality of bit lines of the segment, and the plurality of sense amplifiers simultaneously write the data into memory cells sharing the plurality of sense amplifiers with the plurality of bit lines of the segment and corresponding to at least one another word line, wherein during turning-on time of the word line, the first word line switch, a second word line switch corresponding to the at least one another word line, and the plurality of sense amplifiers are enabled;
   wherein a beginning of the turning-on time of the word line is before a beginning of turning-on time of the at least one another word line, and the turning-on time of the at least one another word line is within the turning-on time of the word line.

6. The memory circuit of claim 5, wherein the segment comprises the at least one another word line or another segment different from the segment comprises the at least one another word line.

7. The memory circuit of claim 5, wherein after the data being written into the memory cells of the segment coupled to the plurality of bit lines of the segment and corresponding to the word line of the segment in turn comprises:
   after the controller enables the active command corresponding to the word line of the segment, the first word line switch corresponding to the word line being turned on and the data being written into the memory cells of the segment coupled to the plurality of bit lines of the segment and corresponding to the word line in turn.

8. A memory circuit into which data can be written quickly, comprising:
   a plurality of memory cells coupled to a sense amplifier together; and
   a controller coupled to the plurality of memory cells, wherein when the controller needs to write identical data into a first memory cell group and at least one second memory cell group of the plurality of memory cells, the controller utilizes the sense amplifier to directly copy data written into the first memory cell group to the at least one second memory cell group;
   wherein a beginning of turning-on time of at least one word line corresponding to the first memory cell group is before a beginning of turning-on time of at least one another word line corresponding to the at least one second memory cell group, and the turning-on time of the at least one another word line corresponding to the at least one second memory cell group is within the turning-on time of the at least one word line corresponding to the first memory cell group;
   wherein during the turning-on time of the at least one word line, a first word line switch, a second word line switch, and the sense amplifier are enabled, wherein the first word line switch corresponds to the at least one word line, and the second word line switch corresponds to the at least one another word line.

9. A memory circuit from which data can be read quickly, comprising:
   a plurality of memory cells coupled to a sense amplifier together; and
   a controller coupled to the plurality of memory cells, wherein when the controller needs to write data stored in a first memory cell group of the plurality of memory cells to at least one second memory cell group of the plurality of memory cells, the controller controls the first memory cell group to be electrically connected to the sense amplifier again, and utilizes the sense amplifier to directly copy the data stored in the first memory cell group to the at least one second memory cell group;
   wherein a beginning of turning-on time of at least one word line corresponding to the first memory cell group is before a beginning of turning-on time of at least one another word line corresponding to the at least one second memory cell group, and the turning-on time of the at least one another word line corresponding to the at least one second memory cell group is within the turning-on time of the at least one word line corresponding to the first memory cell group;
   wherein during the turning-on time of the at least one word line, a first word line switch, a second word line switch, and the sense amplifier are enabled, wherein the first word line switch corresponds to the at least one word line, and the second word line switch corresponds to the at least one another word line.

10. A memory circuit into which data can be written quickly, comprising:
    a command decoder receiving a command control signal group and generating a decode command according to the command control signal group;
    a plurality of memory cells coupled to a sense amplifying circuit together, wherein the sense amplifying circuit comprises a plurality of sense amplifiers; and
    a controller receiving the decode command, and optionally one-time copying data stored in a first memory cell group of the plurality of memory cells to a second memory cell group of the plurality of memory cells according to the decode command;
    wherein a beginning of turning-on time of at least one word line corresponding to the first memory cell group is before a beginning of turning-on time of at least one another word line corresponding to the second memory cell group, and the turning-on time of the at least one another word line corresponding to the second memory cell group is within the turning-on time of the at least one word line corresponding to the first memory cell group;

wherein during the turning-on time of the at least one word line, a first word line switch, a second word line switch, and the sense amplifier are enabled, wherein the first word line switch corresponds to the at least one word line, and the second word line switch corresponds to the at least one another word line.

* * * * *